United States Patent Office 2,873,359

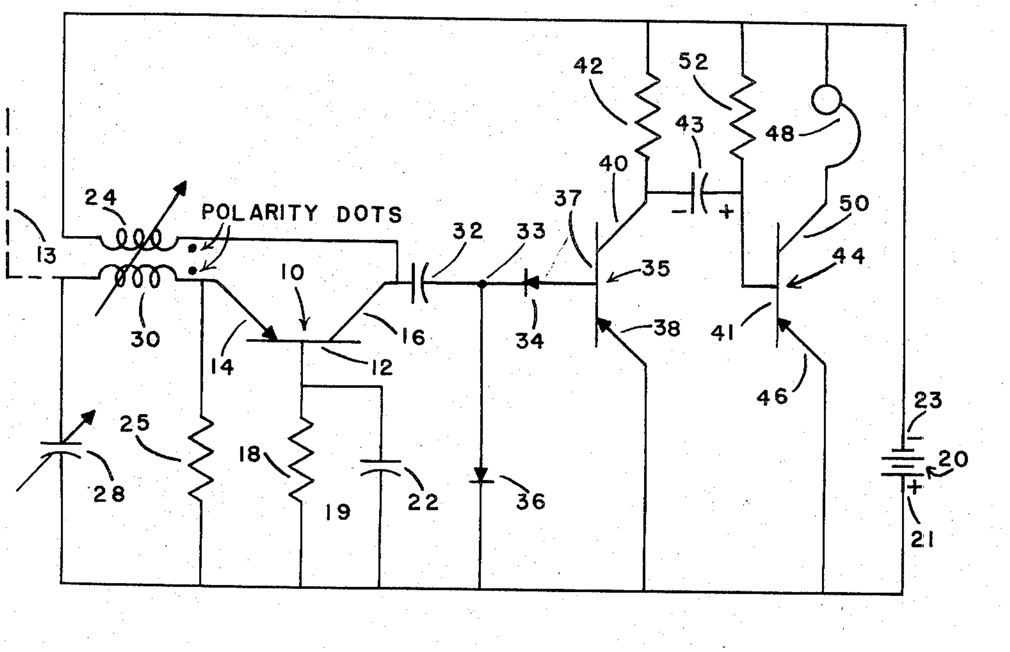
Paul W. Cooper
Joseph F. O'Brien
INVENTORS

Patented Feb. 10, 1959

2,873,359

TRANSISTORIZED RADIO RECEIVER

Paul W. Cooper, Highland Park, and Joseph F. O'Brien, Long Branch, N. J.

Application June 10, 1954, Serial No. 435,776

1 Claim. (Cl. 250—20)

This invention relates generally to transistor circuits and more particularly to a transistorized radio receiver.

It is a primary object of the present invention to provide a transistorized radio receiver capable of extreme miniaturization.

It is a further object to provide a multistage miniaturized radio receiver wherein the circuit Q may be effectively controlled.

Another object is to provide a multistage radio receiver having a tuned amplifier stage including a point contact transistor and audio amplifier stages including junction transistors.

Still another object is to provide a radio receiver as set forth in the preceding object wherein only a single potential source is required.

In accordance with the present invention there is provided a radio receiver comprising a first stage which includes a first transistor having first base, emitter, and collector electrodes, a potential source for applying an operating voltage bias to said collector, means for providing a bias on said emitter positive with respect to said collector, tuning means in circuit with said emitter and base for applying signals of selected frequencies to said emitter, said signals being amplified by said transistor, means in circuit with said collector for feeding back said amplified signals to said emitter, a second stage including a semiconductor diode coupled to said first transistor for detecting said signals, a third stage including a second appropriately biased transistor having second base, emitter and collector electrodes and a load impedance in circuit with said second transistor whereby said detected signals are amplified.

For a better understanding of the present invention together with other and further objects thereof reference is had to the following description taken in connection with the accompanying drawing and its scope will be pointed out in the appended claim.

In the drawing, there is a schematic depiction of a preferred embodiment of the present invention, employing a point contact transistor in the first stage and PNP transistors in the third and fourth stages.

Referring now more particularly to the drawing there is shown a point contact transistor 10 having a base electrode 12, an emitter electrode 14, and a collector electrode 16. A parallel combination 19, of a base resistor 18 and a capacitor 22, is connected between the base 12 of transistor 10 and the positive terminal 21 of a direct current potential source 20. An inductor 24 is connected between collector electrode 16 and the negative terminal 23 of source 20. Emitter electrode 14 is returned to positive potential through a resistor 25 connected between emitter 14 and the positive terminal 21 of source 20. Connected between terminal 21 and emitter 14 is a series combination of a variable capacitor 28 and an inductor 30, inductor 30 being variably coupled to inductor 24 substantially as shown. One electrode of a first semiconductor diode 34 such as of germanium or silicon is coupled to collector electrode 16 through a capacitor 32, and a second semiconductor diode 36 is connected between terminal 21 and junction point 33 of capacitor 32 and diode 34. The other electrode of diode 34 is connected to the base electrode 37 of a PNP type junction transistor 35, the emitter electrode 38 of transistor 35 being connected to terminal 21 and the collector electrode 40 of transistor 35 being connected to terminal 23 through a load resistor 42. Collector 40 is coupled to the base 41 of a second PNP type transistor 44 through a capacitor 43, the emitter electrode 46 of transistor 44 being connected to terminal 21, and a high impedance earpiece 48 being connected between the collector electrode 50 of transistor 44 and negative terminal 23. A bias resistor 52 is provided between base 41 and terminal 23.

In operation, signals are fed to emitter 14 from antenna wire 13 to an intermediate point between variable capacitor 28 and inductor 30. Antenna wire 13 is not necessary in strong signal areas and otherwise need at most be only about 1 foot long. Since collector 16 of transistor 10 is biased negative by source 20 through inductor 24, a sufficient amount of the current flowing in the collector circuit, because of the presence of resistor 18 in the base circuit, is forced to flow through resistance 25 into the emitter circuit resulting in a bias on emitter 14 positive with respect to collector 16. By this arrangement, effective self-biasing is provided. Transistor 10 amplifies the applied signal which is fed back into the emitter circuit by the variable coupling arrangement of inductors 24 and 30. Increased amplification of the signal is thus accomplished and a sharper circuit Q is provided. The amount of feedback is controlled by the variable coupling arrangement of inductors 24 and 30. The amplified signal is fed to a germanium or silicon diode 34 through coupling capacitor 32. Germanium or silicon diode 36 provides a return direct current path and obviously may be replaced by an inductor or other suitable well known device. The size of capacitor 32 is chosen so that it and inductor 24 constitute a broadly parallel tuned circuit as seen by collector 16 of transistor 10 and a broadly series tuned circuit as seen by detector 34. The detected signals are fed from diode 34 to base electrode 37 of transistor 35. It is to be noted that where transistor 35 is a PNP type junction transistor, detectors 34 and 36 are poled so that the direction of easy current flow thereof is the same as the direction of easy current flow between emitter 38 and base 37. An amplified signal is provided across load resistor 42 and the latter is fed to base electrode 41 of transistor 44 through capacitor 43, resistor 52 providing a proper bias on base electrode 41. Earpiece 48 is a high impedance magnetic earpiece and serves as the load impedance in the collector circuit of transistor 44. Since a relatively large capacitance is required for capacitor 43, in the present embodiment, it is preferable to use a tantalytic capacitor.

In the above embodiment, any combination of transistors may be used. For example, NPN transistors could be used in the place of PNP transistors 35 and 44. In such an arrangement, the poling of diodes 34 and 36 would be reversed and a direct current source would be provided to bias the collector electrodes of transistors 35 and 44 positive with respect to the emitters 38 and 46. In order to utilize only junction transistors in the circuit all that would be necessary would be to connect another resistance between base electrode 12 and terminal 23. In the case of a circuit having only PNP transistors, the polarity of source 20 would be the same as shown in the drawing, but in the case of NPN transistors, the polarity of source 20 would have to be reversed. The reason for the necessity of insertion of the resistance between base 12 and terminal 23, if transistor 10 is a junction transistor, may be readily understood when taken in connection with the following equation.

In any transistor circuit using the biasing arrangement as shown, the collector current may be expressed approximately as $$I_c = \frac{I_{c0}}{1 - \frac{\alpha R_b}{R_e + R_b}} \qquad (1)$$

where $I_c$ is the collector current, $I_{c0}$ is the collector current corresponding to zero emitter current, $\alpha$ is the short circuit current amplification from emitter to collector, $R_b$ is the sum of the internal resistance of the base plus the base resistance and $R_e$ is the sum of the internal emitter resistance plus the emitter resistance. In a point contact transistor, where $\alpha$ is greater than unity, $R_b$ and $R_e$ can be adjusted to make $I_c$ whatever value is desired. However, in a junction transistor where $\alpha$ is less than unity, it is obvious from Equation 1 that such is not the case and very little control can be maintained over $I_c$. $I_{c0}$ is very small to begin with in a normal junction transistor and even if $R_b$ was made prohibitively great, no practicable result would be obtained unless $\alpha$ was much closer to unity than is normally found in a junction transistor. By biasing the base directly with the insertion of the resistance between the base and the potential source, $I_c$ can be controlled.

Typical values of components in the embodiment shown in the drawing are:

| | |
|---|---|
| Capacitor **28** | 8–50 micromicrofarads. |
| Inductor **30** | 500 microhenries. |
| Inductor **24** | 500 microhenries. |
| Resistor **25** | 4.7K ohms. |
| Resistor **18** | 900 ohms. |
| Capacitor **22** | 0.01 microfarad. |
| Capacitor **32** | 160 micromicrofarads. |
| Resistor **42** | 2K ohms. |
| Capacitor **43** | 4 microfarads (tantalytic). |
| Resistor **52** | 120K ohms. |
| Earpiece **48** | 2000 ohms. |
| Source **20** | 6 volts (miniature battery). |
| Transistor **10** | Point contact. |
| Transistor **35** | PNP junction. |
| Transistor **44** | PNP junction. |

Using components having the foregoing values, a radio receiver having sharp selectivity, sensitivity of 50 microvolts, and an output in excess of 1 milliwatt is provided. Since comfortable listening requires only about 300 microwatts, it is to be noted that extreme miniaturization is made possible with the present invention. A typical size of a container for a set including every element but the earpiece is 1 x 1.50 x 0.3 inches, and the total weight of the device, not including the earpiece, is about an ounce. Such a radio may be worn on the wrist, used as a locket, built into a hat, and incorporated into a fountain pen like container.

If it is desired to utilize a junction transistor in place of point contact transistor 10, it would be desirable to provide as inductor 24, an inductor having more turns than inductor 30. This is necessary since the $\alpha$ of a junction transistor is less than one and the regenerative feedback could not be sufficiently large to provide oscillation otherwise.

An alternate arrangement for controlling the amount of regenerative feedback would be to include a variable resistor between terminal 23 and coil 24. With this arrangement, coils 24 and 30 are first physically positioned so that normally there is oscillation present. As the resistance of the variable resistor is increased, the Q of the circuit is lowered until there is no longer any oscillation. A second alternative is to set coils 24 and 30 physically so that there is no oscillation present and then insert a variable capacitor between emitter 14 and collector 16. Now, by adjusting the value of the variable capacitor, the amount of feedback may be controlled. A third alternative is to replace inductor 24 in the second alternative with a resistor and feedback is again controlled by adjusting the capacitor.

While there have been described what are, at present, believed to be the preferred embodiments of the present invention, it will be obvious to those skilled in the art that many various changes and modifications may be made therein without departing from the invention, and it is, therefore, aimed in the appended claim to cover all such changes and modifications as fall within the true spirit and scope of the invention.

What is claimed:

A miniaturized receiver comprising a first transistor having a first emitter, base, and collector electrodes, a direct current potential source for applying a negative bias to said collector, a parallel combination of a first resistor and a first capacitor in circuit between said base and the positive terminal of said potential source, a second resistor having one end thereof connected to said emitter and its other end to the positive terminal of said potential source, a first inductor in circuit between said collector and the negative terminal of said potential source, whereby a negative bias applied to said collector causes a direct current to flow through the resistor of said parallel combination and the resistor between said emitter and said positive terminal thereby providing a positive bias current for said emitter, a series combination of a variable capacitor and a second inductor connected between said other end of said second resistor and said emitter, said first and second inductors being variably mutually coupled, a second junction transistor consisting of a semiconductor body having at least second emitter, collector, and base electrodes, a series combination of a second capacitor and a first semiconductor diode connected between said first collector and said second base electrodes whereby said second capacitor and said first inductor constitute a broadly parallel tuned circuit for said first collector and a broadly series tuned circuit for said first rectifier, a second semiconductor rectifier connected between said positive terminal and a point intermediate said second capacitor and said first rectifier, both of said rectifiers being poled in the same direction, second emitter being connected to said positive terminal, a third resistor connected between said negative terminal and said second collector, a third junction transistor having third emitter, base, and collector electrodes, said third emitter being connected to said positive terminal, a third capacitor connected between said second collector and said third base electrodes, a fourth resistor connected between said negative terminal and said third base electrode, a high impedance magnetic auditory device connected between said third collector and said third negative terminal.

References Cited in the file of this patent

UNITED STATES PATENTS

| | | |
|---|---|---|
| 2,550,518 | Barney | Apr. 24, 1951 |
| 2,556,296 | Meacham | June 12, 1951 |
| 2,644,914 | Kircher | July 7, 1953 |
| 2,660,624 | Bergson | Nov. 24, 1953 |
| 2,751,497 | Duncan | June 19, 1956 |

OTHER REFERENCES

Experimental Transistor Receiver by Bettridge, Wireless World, January 1954, pages 2 to 5.

Transistor Broadcast Regenerator by Sulzer, Electronics, June 1953, page 200.

"Dick Tracy's Radio Comes to Life," page 108 of Radio and Television News, September 1952.